United States Patent
Glatfelter

(10) Patent No.: US 10,831,937 B2
(45) Date of Patent: Nov. 10, 2020

(54) FORMATION OF A SIMPLIFIED MODEL

(71) Applicant: The Boeing Company, Chicago, IL (US)

(72) Inventor: John William Glatfelter, West Chester, PA (US)

(73) Assignee: The Boeing Company, Chicago, IL (US)

( * ) Notice: Subject to any disclaimer, the term of this patent is extended or adjusted under 35 U.S.C. 154(b) by 1115 days.

(21) Appl. No.: 14/844,621

(22) Filed: Sep. 3, 2015

(65) Prior Publication Data

US 2017/0068750 A1    Mar. 9, 2017

(51) Int. Cl.
*G06F 30/00*   (2020.01)
*G06T 19/00*   (2011.01)
*G06K 9/52*    (2006.01)

(52) U.S. Cl.
CPC .............. *G06F 30/00* (2020.01); *G06K 9/525* (2013.01); *G06T 19/00* (2013.01)

(58) Field of Classification Search
CPC .......... G06F 30/00; G06T 19/00; G05K 9/525
USPC ............ 703/2, 3; 702/178; 706/10; 235/454; 382/305
See application file for complete search history.

(56) References Cited

U.S. PATENT DOCUMENTS

| | | | | |
|---|---|---|---|---|
| 5,850,044 A * | 12/1998 | Spletzer | ................... | G01L 5/161 73/862.041 |
| 6,092,059 A * | 7/2000 | Straforini | ............. | G06K 9/6292 706/10 |
| 6,220,743 B1 * | 4/2001 | Campestre | ............. | G06Q 10/06 700/97 |
| 7,158,853 B2 * | 1/2007 | Sakai | ................... | G06K 9/4685 700/117 |
| 7,912,674 B2 * | 3/2011 | Killoren Clark | ... | G06F 19/3406 702/178 |
| 8,162,219 B2 * | 4/2012 | Pine | ........................ | G06K 9/00 235/454 |
| 8,626,472 B2 * | 1/2014 | Solinsky | ................ | A61B 5/112 702/160 |
| 9,186,096 B2 * | 11/2015 | Solinsky | ................ | A61B 5/112 |
| 9,501,498 B2 * | 11/2016 | Wnuk | ............... | G06F 17/30268 |
| 10,331,808 B1 * | 6/2019 | Kanthasamy | ....... | G06F 17/5009 |
| 2008/0269942 A1 * | 10/2008 | Free | ........................ | G06F 30/00 700/182 |

(Continued)

FOREIGN PATENT DOCUMENTS

WO    WO2012149961 A1    11/2012

OTHER PUBLICATIONS

Extended European Search Report, dated Jan. 23, 2017, regarding Application No. EP16187176.9, 10 pages.
Bustos et al., "Feature-Based Similarity Search in 3D Object Databases," ACM Computing Surveys, vol. 37, No. 4, Dec. 2005, pp. 345-387.

(Continued)

*Primary Examiner* — Thai Q Phan
(74) *Attorney, Agent, or Firm* — Yee & Associates, P.C.

(57) ABSTRACT

A method and apparatus for the formation of a simplified model. A computer system comprises a simplification system. The simplification system receives a plurality of components from a complex model, determines a number of moments of inertia for each component of the plurality of components, and creates a simplified model using the number of moments of inertia for the each component of the plurality of components, wherein the complex model is a three-dimensional computer model.

23 Claims, 12 Drawing Sheets

(56) References Cited

U.S. PATENT DOCUMENTS

| | | | | |
|---|---|---|---|---|
| 2009/0173791 | A1* | 7/2009 | Pine | G06K 9/00 235/454 |
| 2010/0153077 | A1* | 6/2010 | Suresh | G06F 17/5018 703/2 |
| 2013/0053995 | A1* | 2/2013 | Hashimoto | B29C 64/00 700/97 |
| 2013/0324888 | A1* | 12/2013 | Solinsky | A61B 5/112 600/595 |
| 2014/0324904 | A1* | 10/2014 | Yamamoto | G06F 30/00 707/769 |
| 2015/0302027 | A1* | 10/2015 | Wnuk | G06F 17/30268 382/305 |
| 2015/0356205 | A1* | 12/2015 | Nalluri | G06F 17/50 703/1 |
| 2016/0011215 | A1* | 1/2016 | Holmes | G01N 35/026 506/2 |
| 2016/0063136 | A1* | 3/2016 | Kannan | G06T 17/10 703/1 |
| 2016/0075091 | A1* | 3/2016 | Cable | B29C 64/20 528/272 |
| 2016/0314341 | A1* | 10/2016 | Maranzana | G06F 30/00 |
| 2017/0004621 | A1* | 1/2017 | Maranzana | G06F 16/5854 |
| 2017/0066092 | A1* | 3/2017 | Yamamoto | B23P 21/00 |

OTHER PUBLICATIONS

Gao et al., "Feature suppression based CAD mesh model simplification," Computer Aided Design, vol. 42, No. 12, Dec. 2010, pp. 1178-1188.

Hamdi et al., "Idealization of CAD Geometry Using Design and Analysis Integration Features Models," International Conference on Engineering Design (ICED'07), Aug. 2007, 11 pages.

Russ, Development of a CAD Model Simplification Framework for Finite Element Analysis, Master of Science Thesis, University of Maryland Department of Mechanical Engineering, Jan. 2012, 121 pages.

Thakur et al., "A survey of CAD model simplification techniques for physics-based simulation applications," Computer-Aided Design, vol. 41, copyright 2009, pp. 65-80.

Quadros et al., "Defeaturing CAD Models Using a Geometry-Based Size Field and Facet-Based Reduction Operators," Engineering with Computers, vol. 28, No. 3, Jul. 2012, 18 pages.

"Defeaturing Workflow," Spatial Corp., copyright 2013, 4 pages, accessed Aug. 28, 2015. http://doc.spatial.com/articles/d/e/f/Defeaturing_Workflow_935c_html.

European Examination Report, dated Jan. 12, 2018, regarding Application No. 16187176.9, 7 pages.

* cited by examiner

FORMATION OF A SIMPLIFIED MODEL

BACKGROUND INFORMATION

1. Field

The present disclosure relates generally to three-dimensional models. In particular, the present disclosure relates to a method and apparatus for simplifying three-dimensional models.

2. Background

In designing and manufacturing products, a design of the product is often generated using computer-aided design (CAD) systems. These products may include, for example, cars, aircraft, buildings, spacecraft, engines, and other types of products.

During design, the three-dimensional models may have high levels of detail. These complex models may include a large number of components. Some models may include tens of millions of polygons. Further, the components may be geometrically complex.

Analysis, such as structural or thermal analysis, may be performed during the design of a product. The analysis may provide information regarding performance of the design of the product without creating a prototype. For three-dimensional models with high levels of detail, the time to return an analysis result may be undesirably long. In some examples, analysis of a three-dimensional model may take days or even weeks to complete. Until results from the analysis are returned, designers may be idle. Accordingly, large analysis times may increase product development time.

Additionally, large analysis times may increase product development costs. Further, long analysis times may use an undesirable amount of computer resources. For example, processors performing an analysis on a three-dimensional model may not be utilized for other processes. Therefore, it would be desirable to have a method and apparatus that take into account at least some of the issues discussed above, as well as other possible issues.

SUMMARY

In an illustrative embodiment, a computer system is provided. The computer system comprises a simplification system. The simplification system receives a plurality of components from a complex model, determines a number of moments of inertia for each component of the plurality of components, and creates a simplified model using the number of moments of inertia for the each component of the plurality of components, wherein the complex model is a three-dimensional computer model.

In another illustrative embodiment, a method for forming a simplified model is provided. A computer system receives a plurality of components from a complex model, wherein the complex model is a three-dimensional computer model. The computer system then determines a number of moments of inertia for each component of the plurality of components. Next the computer system creates the simplified model using the number of moments of inertia for the each component of the plurality of components, wherein the simplified model is a three-dimensional computer model.

In a further illustrative embodiment, a method for forming a simplified model is provided. A computer system receives a plurality of components from a complex model, wherein the complex model is a three-dimensional computer model. The computer system then computes measurements for each component of the plurality of components. The computer system also determines a number of moments of inertia for the each component of the plurality of components. The computer system further selects a respective recognized shape for the each component of the plurality of components from a shape library based on the measurements and the number of moments of inertia for the each component of the plurality of components. The computer system also generates a respective new component for the each component of the plurality of components using the respective recognized shape for the each component of the plurality of components. The computer system further replaces the each component of the plurality of components with its respective new component to create the simplified model, wherein the simplified model is a three-dimensional computer model.

In yet a further embodiment, a method for forming a simplified model is provided. The method receives a plurality of components from a complex model, wherein the complex model is a three-dimensional computer model. The method then forms a respective bounding box around each component of the plurality of components. The method then replaces the each component of the plurality of components with a respective new component using a recognized shape and the respective bounding box for the each component of the plurality of components to form the simplified model, wherein the simplified model is a three-dimensional computer model.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that currently, complex three-dimensional models may be used to perform an analysis. Performing an analysis on a high fidelity model may produce a result having a level of accuracy that may not be required. Performing an analysis on a complex three-dimensional model may include detailed meshing, using matrix solvers and undesirable amounts of computer horsepower.

The illustrative embodiments recognize and take into account that computer resources may have a value. By decreasing the time needed to perform an analysis on a model, computer resources may be available for other processes. Thus, by decreasing the time to perform an analysis, the efficiency of a computer system may be increased. Further, a computer system may perform a larger number of analyses in a period of time. The illustrative embodiments thus recognize and take into account that it may be desirable to have a method and apparatus that provide results of an analysis for a model within a desirable period of time using currently available computer systems.

The illustrative embodiments recognize and take into account that designers may manually alter a three-dimensional model. For example, a designer may choose to remove unnecessary small washers or screws from the model of interest. An analysis may then be performed on the model. However, manually removing small features of a three-dimensional model may take an undesirable amount of engineering design labor. Further, each time a model changes, manual removal of small features may be performed again to perform an analysis.

The illustrative embodiments recognize and take into account that manually removing small features may be prone to error. The illustrative embodiments further recognize and take into account that manually removing small features may be an undesirable job for designers. Designers may quickly tire of performing this feature removal process.

Figure 1:
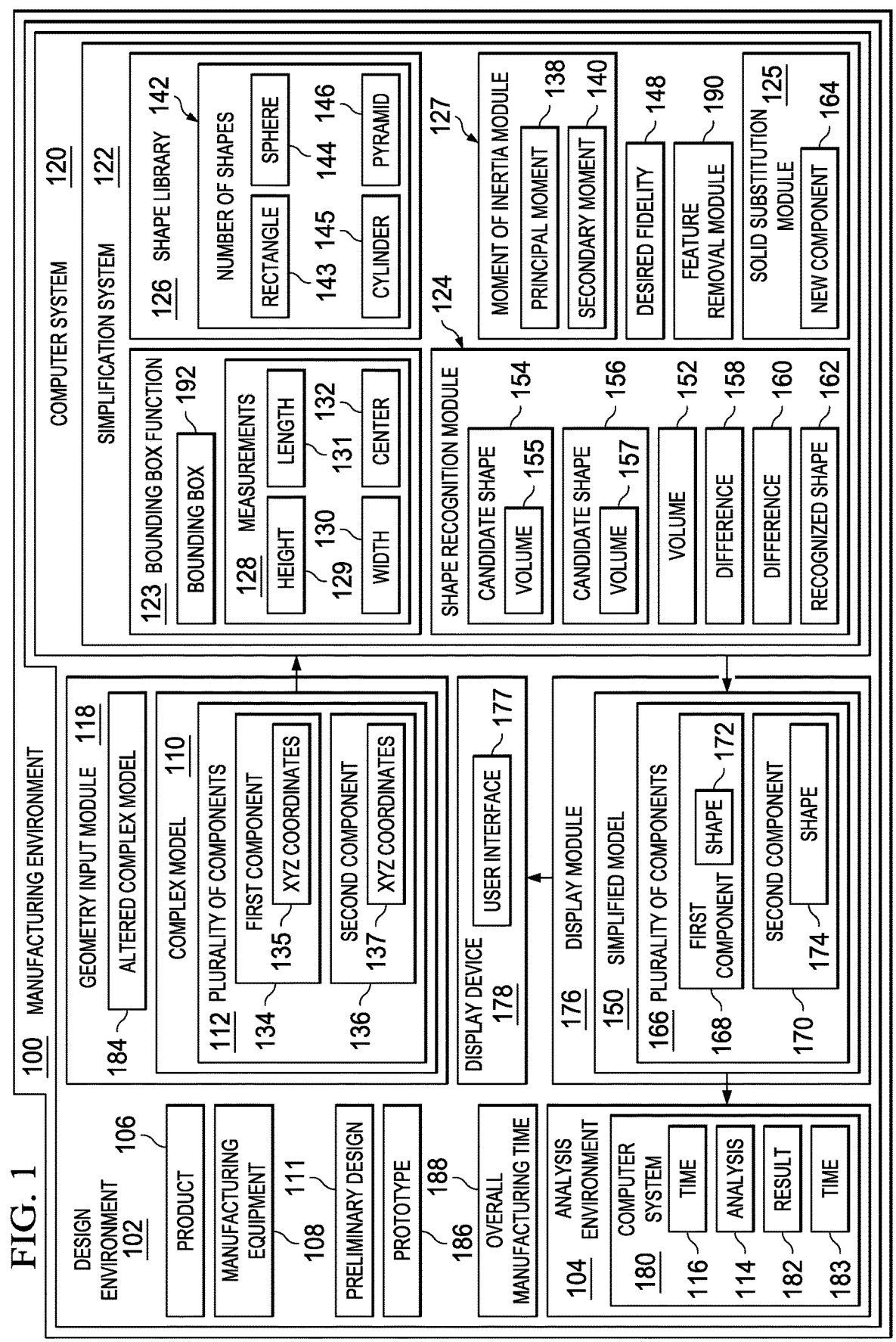
FIG. 1 is an illustration of a block diagram of a manufacturing environment in accordance with an illustrative embodiment.

With reference now to the Figures, and in particular, with reference to FIG. 1, an illustration of a block diagram of a manufacturing environment is depicted in accordance with an illustrative embodiment. Manufacturing environment 100 includes design environment 102 and analysis environment 104. Product 106 may be designed using design environment 102 and manufactured using manufacturing equipment 108 of manufacturing environment 100.

Design environment 102 may be used to design product 106. In some illustrative examples, product 106 may also be referred to as a structure. Complex model 110 in design environment 102 may be used during design of product 106. Complex model 110 may be a virtual model. Complex model 110 may be referred to as a three-dimensional computer model. Complex model 110 may be preliminary design 111. In some illustrative examples, preliminary design 111 may be an early iteration of a design that leads to product 106. For example, when preliminary design 111 is an early iteration, a later iteration of complex model 110 may be used directly to form product 106. For example, preliminary design 111 may be a design that is altered and then used to form product 106.

In some illustrative examples, preliminary design 111 may instead be a conceptual design or an exploratory design alternative. When preliminary design 111 is a conceptual design or an exploratory design alternative, complex model 110 may be used indirectly to form product 106. Data from complex model 110 may be used to make decisions regarding a design for product 106, as a comparison to a design for product 106, or as one of a variety of alternative designs that may be compared to select a single design for product 106. For example, if product 106 is an aircraft, there may be a plurality of options for a wing flap design. Each alternative option for the wing flaps may be in a different model. In this illustrative example, complex model 110 may one of the plurality of models. Although complex model 110 may not be the final design for product 106, knowledge gained from complex model 110 may be used during design of product 106.

Complex model 110 may include plurality of components 112. Complex model 110 may have a high fidelity. For example, complex model 110 may have a desirable fidelity for manufacturing of product 106. However, performing analysis 114 on complex model 110 may take time 116. Time 116 may be an undesirable period. For example, time 116 may be days or even weeks.

To perform analysis 114, the fidelity of complex model 110 may be greater than required. Accordingly, complex model 110 may be simplified prior to performing analysis 114.

To simplify complex model 110, geometry input module 118 may provide complex model 110 to computer system 120. Computer system 120 is a hardware system that includes one or more data processing systems. When more than one data processing system is present, those data processing systems may be in communication with each other using a communications medium. The communications medium may be a network. The data processing systems may be selected from at least one of a computer, a server computer, a workstation, a tablet computer, a laptop computer, a mobile phone, or some other suitable data processing system.

As used herein, the phrase "at least one of," when used with a list of items, means different combinations of one or more of the listed items may be used, and only one of each item in the list may be needed. In other words, "at least one of" means any combination of items and number of items may be used from the list but not all of the items in the list are required. The item may be a particular object, thing, or a category.

For example, "at least one of item A, item B, or item C" may include, without limitation, item A, item A and item B, or item B. This example also may include item A, item B, and item C or item B and item C. Of course, any combinations of these items may be present. In other examples, "at least one of" may be, for example, without limitation, two of item A; one of item B; and ten of item C; four of item B and seven of item C; or other suitable combinations.

Geometry input module 118 may retrieve complex model 110 in any desirable CAD format including DXF, IGES, STEP, or any other desirable format. In some illustrative examples, geometry input module 118 may retrieve complex model 110 in a CAD-neutral format.

In the following illustrative example of a code snippet, geometry input module 118 may retrieve complex model 110 in a STEP format.

```
(generic-CAD-model    :type step-model
                      :filename "c:/temp/car-assembly.stp" )
```

After retrieving complex model 110, geometry input module 118 provides complex model 110 to simplification system 122 of computer system 120. Simplification system 122 may be implemented in software, hardware, firmware, or a combination thereof. When software is used, the operations performed by simplification system 122 may be implemented in program code configured to run on a processor unit. When firmware is used, the operations performed by simplification system 122 may be implemented in program code and data and stored in persistent memory to run on a processor unit. When hardware is employed, the hardware may include circuits that operate to perform the operations in simplification system 122.

Simplification system 122 includes bounding box function 123, shape recognition module 124, solid substitution module 125, shape library 126, and moment of inertia module 127. Bounding box function 123 computes measurements 128 for plurality of components 112. Measurements 128 may include at least one of height 129, width 130, length 131, or center 132.

Bounding box function 123 may compute measurements 128 for each component of plurality of components 112 using the geometric XYZ coordinate of the respective component as a basis for the calculation. For example, bounding box function 123 may compute measurements 128 for first component 134 using xyz coordinates 135. As another example, bounding box function 123 may compute measurements 128 for second component 136 using xyz coordinates 137.

In the following illustrative example of a code snippet, bounding box function 123 may compute measurements 128 for a CAD-neutral component such as first component 134 or second component 136 of plurality of components 112.

```
(general-component-part
   :input (the :cad-neutral-component)
   :attributes (
      :solid (the :cad-neutral-component)
      :solid-length (the :solid :local-bounding-box :length)
      :solid-width (the :solid :local-bounding-box :width)
      :solid-height (the :solid :local-bounding-box :height)
      :solid-center (the :solid :local-bounding-box :center)
   )
```

Moment of inertia module 127 may use measurements 128 to determine principal moment 138 and secondary moment 140. Principal moment 138 and secondary moment 140 may be determined using traditional physics and mathematical calculations. Principal moment 138, secondary moment 140, and center 132 may positively locate the respective component of plurality of components 112. Principal moment 138, secondary moment 140, and center 132 may establish a basis for comparisons performed by shape recognition module 124.

Shape recognition module 124 may compare each component of plurality of components 112 to number of shapes 142 of shape library 126. As used herein, "a number of," when used with reference to items, means one or more items. Thus, number of shapes 142 includes one or more shapes. Number of shapes 142 may include any desirable basic shape. In some illustrative examples, number of shapes 142 may include at least one of rectangle 143, sphere 144, cylinder 145, or pyramid 146. In some illustrative examples, number of shapes 142 may only include one shape. In other illustrative examples, number of shapes 142 may include more than one shape.

Although number of shapes 142 may include more than one shape, shape recognition module 124 may only compare one shape of number of shapes 142 to the respective component of plurality of components 112. In some illustrative examples, shape recognition module 124 may compare each shape of number of shapes 142 to a respective component of plurality of components 112. In some illustrative examples, a subset of number of shapes 142 may be compared to a respective component of plurality of components 112.

A quantity of shapes to be compared to a respective component of plurality of components 112 may be selected based on desired fidelity 148 of simplified model 150 to be produced. For example, increasing desired fidelity 148 may increase the quantity of shapes of number of shapes 142 to be compared to the respective component. As another example, decreasing desired fidelity 148 may decrease the quantity of shapes of number of shapes 142 to be compared to the respective component.

In some illustrative examples, desired fidelity 148 may be a default setting. In some illustrative examples, the default setting may be a global default setting for all models and all analyses. In other illustrative examples, the default setting may be one of a plurality of default settings selected based on user input. For example, a default setting for desired fidelity 148 may be selected from a plurality of default settings based on at least one of identity of analysis 114, the stage of design of product 106, or a desired value for number of shapes 142. For example, during preliminary stages of design for product 106, desired fidelity 148 may be less than during later stages of design. As another example, specific shapes may be desirable for modeling product 106. Any of identity of analysis 114, the stage of design of product 106, or a desired value for number of shapes 142 may be provided by a user.

In other illustrative examples, desired fidelity 148 may not be a default setting. In these illustrative examples, desired fidelity 148 may be manually selected by a user.

Shape library 126 may contain 1 to n shapes for the purpose of geometry simplification. For each candidate shape in shape library 126, shape recognition module 124 creates and scales a three-dimensional solid. Afterwards, a volume of the candidate shapes is computed. A difference between the volume of each candidate shape and volume 152 of the respective component of plurality of components 112 is calculated. The candidate shape with the lowest difference may be selected.

In one illustrative example, shape recognition module 124 may compare first component 134 to number of shapes 142 of shape library 126. In this example, shape recognition module 124 may only compare first component 134 to two shapes in shape library 126. For example, shape recognition module 124 may compare first component 134 to rectangle 143 and sphere 144. Shape recognition module 124 may form candidate shape 154 having volume 155 using rectangle 143. Shape recognition module 124 may form candidate shape 156 having volume 157 using sphere 144. Volume 155 and volume 152 may have difference 158. Volume 157 and volume 152 may have difference 160. The smaller of difference 158 and difference 160 may be determined. Candidate shape 154 or candidate shape 156 may be selected based on which of difference 158 or difference 160 is smaller.

If difference 158 is smaller, rectangle 143 may be selected as recognized shape 162. If difference 160 is smaller, sphere 144 may be selected as recognized shape 162.

Solid substitution module 125 may create new component 164 for each component of plurality of components 112 using recognized shape 162 for the respective component. Solid substitution module 125 may also delete the original component. All original metadata is transferred to new component 164. The original metadata may include at least one of a part name, a material type, a color, or any other desirable characteristic of the original component.

Thus, solid substitution module 125 may replace plurality of components 112 with plurality of components 166 to form simplified model 150. Simplified model 150 may be a virtual model. Simplified model 150 may be referred to as a three-dimensional computer model.

Plurality of components 166 may include first component 168 and second component 170. Solid substitution module 125 may replace first component 134 with first component 168. Solid substitution module 125 may replace second component 136 with second component 170.

First component 168 has shape 172. Shape 172 is one of number of shapes 142. Second component 170 has shape 174. Shape 174 is one of number of shapes 142. In some illustrative examples, shape 172 and shape 174 may be the same one of number of shapes 142. In some illustrative examples, shape 172 and shape 174 may be different ones of number of shapes 142.

Display module 176 may render simplified model 150 in user interface 177 on display device 178. Display device 178 is configured to display information to a user. Display device 178 may comprise, for example, without limitation, a monitor, a touch screen, a laser display, a holographic display, a virtual display device, and/or some other type of display device.

By displaying simplified model 150 on display device 178, a design engineer or other user may view simplified model 150. In some illustrative examples, a design engineer or other user may confirm that simplified model 150 is a desired simplified version of complex model 110.

After forming simplified model 150, analysis 114 may be run on simplified model 150. Analysis 114 may be run on simplified model 150 in analysis environment 104. Analysis environment 104 may include computer system 180. Computer system 180 is a hardware system that includes one or more data processing systems. When more than one data processing system is present, those data processing systems may be in communication with each other using a communications medium. The communications medium may be a network. The data processing systems may be selected from at least one of a computer, a server computer, a workstation, a tablet computer, a laptop computer, a mobile phone, or some other suitable data processing system.

As depicted, analysis environment 104 has computer system 180 separate from computer system 120. However, in some illustrative examples, analysis environment 104 may not have computer system 180. In these illustrative examples, analysis environment 104 includes computer system 120 and may run analysis 114 on computer system 120.

Analysis 114 of simplified model 150 produces result 182 in time 183. Time 183 is less than time 116 of performing analysis 114 on complex model 110. In some illustrative examples, time 183 may be considerably less than time 116. For example, time 183 may be a number of hours while time 116 is a number of days.

By performing analysis 114 on simplified model 150 rather than complex model 110, computer system 180 may be able to perform more analyses in the same period of time. By performing analysis 114 on simplified model 150 rather than complex model 110, computer system 180 may have more available time to perform analyses. By performing analysis 114 on simplified model 150 rather than complex model 110, analysis environment 104 may have less advanced or fewer computer resources in computer system 180.

Analysis 114 may be a structural analysis or a thermal analysis. Result 182 may be used by a design engineer to evaluate complex model 110. For example, if result 182 has a desirable value, design engineers may move forward with designing product 106 using complex model 110.

As another example, if result 182 has an undesirable value, a design engineer may alter complex model 110 to form altered complex model 184. Altered complex model 184 may have a changed design for product 106. After forming altered complex model 184, altered complex model 184 may be simplified using simplification system 122. Analysis 114 may then be run on simplified model 150, formed by simplifying altered complex model 184. These simplification, analysis, and altering steps may be repeated until a result of analysis 114 is a desired result.

Thus, result 182 may be used to explore design alternatives during design of product 106 to make design decisions regarding product 106. Result 182 may be used to make decisions regarding a design of product 106. Result 182 may be used in forming at least one of prototype 186 or product 106. For example, result 182 may be used by design engineers to alter complex model 110. An iteration of complex model 110 incorporating changes based on result 182 may be used to form at least one of prototype 186 or product 106. Thus, knowledge gleaned from result 182 may be used to manufacture at least one of product 106 or prototype 186 using manufacturing equipment 108.

In some examples, simplification system 122 may allow for design of product 106 without creating prototype 186. For example, analysis 114 of simplified model 150 may be performed rather than forming prototype 186.

Use of simplification system 122 may reduce overall manufacturing time 188 of product 106. For example, by performing analysis 114 of simplified model 150 rather than analysis of complex model 110, overall manufacturing time 188 may be reduced by at least the difference between time 183 and time 116. Further, a plurality of analyses may be performed during design of product 106. By using simplification system 122 during multiple analyses, each analysis may have a reduced run time. Further, reducing the number of prototypes created may further reduce overall manufacturing time 188.

The illustration of manufacturing environment 100 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, as depicted, simplification system 122 may include feature removal module 190. Feature removal module 190 may remove components or features of complex model 110 below a desired size threshold. For example, feature removal module 190 may remove rivets, drill holes, fasteners, or other components smaller than a desired size. Features removed by feature removal module 190 may not be represented in simplified model 150. For example, components in plurality of components 112 may each be replaced by a component of plurality of components 166. Features removed by feature removal module 190 will not be replaced by a shape from shape recognition module 124.

By simplifying complex model 110, a model having a smaller file size may be produced. Further, by simplifying complex model 110 to form simplified model 150, a time of performing analysis 114 may be reduced. For example, analysis 114 may take less time for a smaller or less complex model such as simplified model 150. Reducing the time to perform analysis 114 may also reduce processing resources of computer system 180 used by analysis 114.

As a result, computer system 120 operates as a special purpose computer system, which enables at least one of faster performance of analysis 114 or more accurate benchmarking, as compared to currently used systems and models. For example, simplification system 122 may be used to transform computer system 120 into a special purpose computer system. In particular, simplification system 122 transforms computer system 120 into a special purpose computer system as compared to currently available general computer systems that do not have simplification system 122.

For example, simplification system 122 may enable the analysis of a current design in a manner that increases the speed at which information, such as analysis results of the design, may be reviewed by a client. In particular, simplification system 122 may automatically simplify complex model 110 to form simplified model 150. Specifically, simplification system 122 may enable analysis 114 of simplified model 150 rather than complex model 110 without manual simplification. Further, the manner in which simplification system 122 simplifies complex model 110 may allow for an operator to control desired fidelity 148 of simplified model 150.

As another example, bounding box function 123 is discussed above as computing measurements 128. In some examples, bounding box function 123 may form bounding box 192 around a component such as first component 134. Bounding box function 123 may form a respective bounding box such as bounding box 192 around each component of plurality of components 112. In these examples, solid substitution module 125 may replace each component such as first component 134 with a respective new component such as new component 164 using recognized shape and the respective bounding box for the each component of plurality of components 112 to form simplified model 150.

Figure 2:
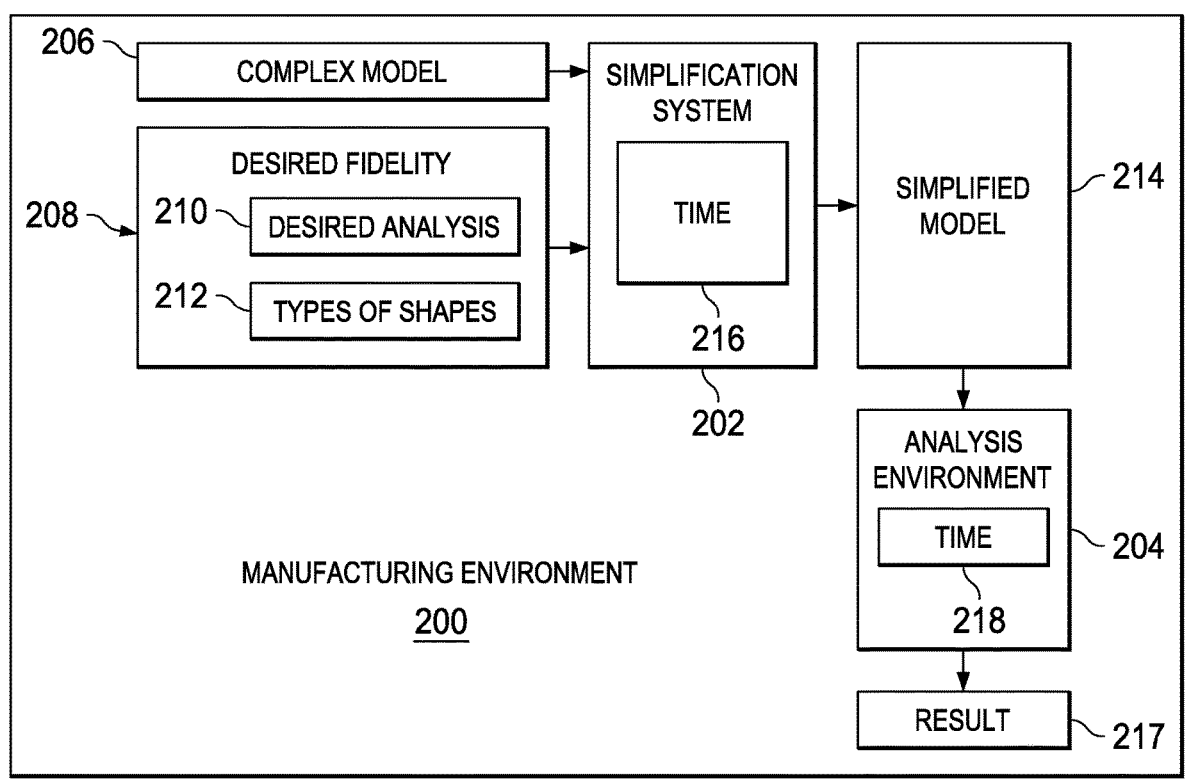
FIG. 2 is an illustration of a block diagram of a manufacturing environment in accordance with an illustrative embodiment.

Turning now to FIG. 2, an illustration of a block diagram of a manufacturing environment is depicted in accordance with an illustrative embodiment. Manufacturing environment 200 may display a simplified flow of information in manufacturing environment 100.

Manufacturing environment 200 may include simplification system 202 and analysis environment 204. Complex model 206 may be provided to simplification system 202. Providing complex model 206 to analysis environment 204 would result in an undesirable amount of time spent on performing an analysis.

Desired fidelity 208 may also be provided to simplification system 202. In some illustrative examples, desired fidelity 208 may be provided by a user providing input. Desired fidelity 208 may include at least one of desired analysis 210 or types of shapes 212. In some illustrative examples, desired fidelity 208 may have a default setting. If desired fidelity 208 is not manually changed based on at least one of desired analysis 210 or types of shapes 212, simplification system 202 may use the default setting for desired fidelity 208.

Simplification system 202 forms simplified model 214 using complex model 206 and desired fidelity 208. Simplification system 202 may spend time 216 to form simplified model 214.

Simplified model 214 may be provided to analysis environment 204. Analysis environment 204 may perform an analysis on simplified model 214 to produce result 217 in time 218. Time 218 of performing an analysis on simplified model 214 is less than the time to perform the analysis on complex model 206. Further, the sum of time 216 and time 218 may be less than a time to run the same analysis on complex model 206.

Figure 3:
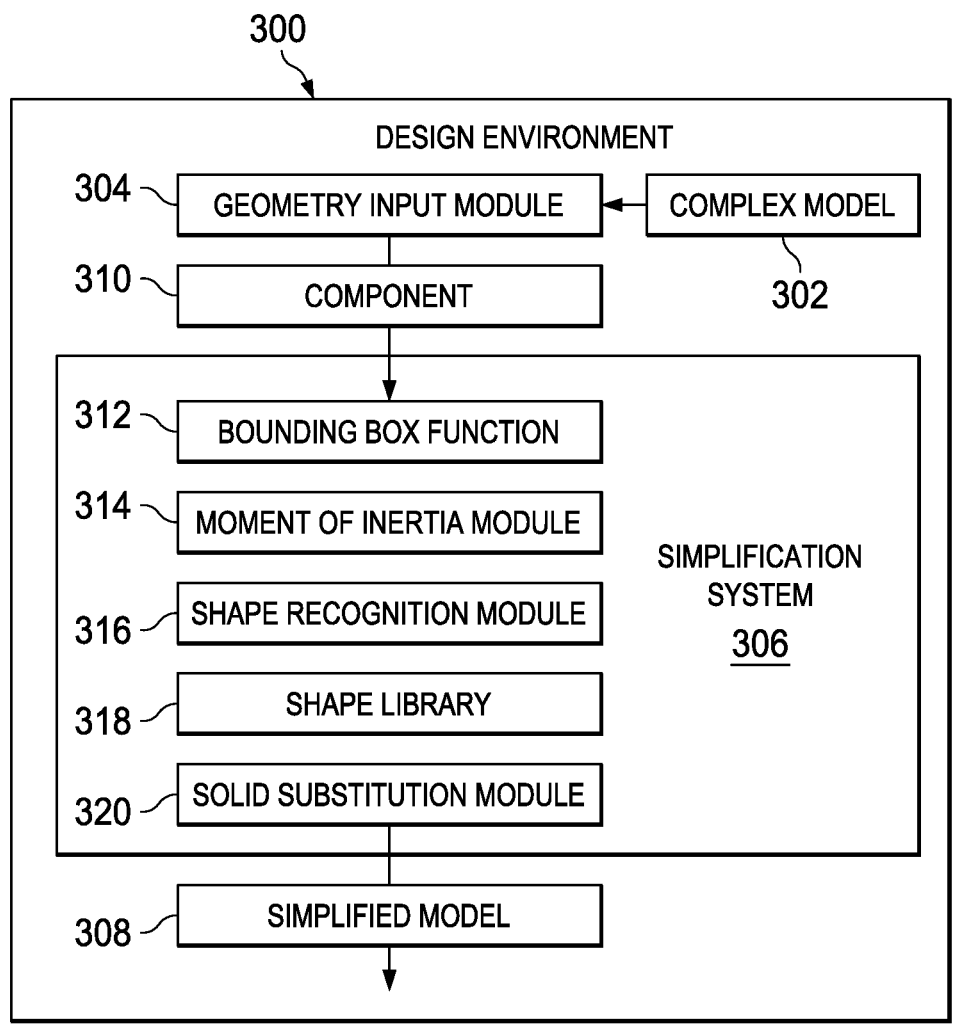
FIG. 3 is an illustration of a block diagram of a design environment in accordance with an illustrative embodiment.

Turning now to FIG. 3, an illustration of a block diagram of a design environment is depicted in accordance with an illustrative embodiment. Design environment 300 may be an implementation of design environment 102 of FIG. 1.

Complex model 302 may be provided to geometry input module 304. Geometry input module 304 may send each component of complex model 302 to simplification system 306 to form simplified model 308. As depicted, geometry input module 304 sends component 310 to bounding box function 312 of simplification system 306. Component 310 may be only a single component of complex model 302.

Bounding box function 312 may form a respective bounding box around each component of complex model 302. For example, bounding box function 312 may form a bounding box around component 310. Bounding box function 312 may calculate measurements of component 310. The measurements may include at least one of a height, a width, a length, or a center of component 310.

Moment of inertia module 314 may determine a number of moments of inertia for each component of a plurality of components of complex model 302. For example, moment of inertia module 314 may determine a number of moments of inertia for component 310. The number of moments of inertia may include at least one of a principal moment of inertia or a secondary moment of inertia.

Shape recognition module 316 may use the output of bounding box function 312 and the output of moment of inertia module 314 in combination with shape library 318 to select a recognized shape. The recognized shape is a type of shape present in shape library 318. For example, the recognized shape may be a rectangular shape present in shape library 318.

In some illustrative examples, shape recognition module 316 may select a shape from shape library 318 by forming a number of three-dimensional shapes based on shape library 318. Shape recognition module 316 may then compare the number of three-dimensional shapes to component 310. For example, a volume of each of the number of three-dimensional shapes may be compared to the volume of component 310. The three-dimensional shape having a volume closest to the volume of component 310 may be the recognized shape.

Solid substitution module 320 may create a new component using the selected shape. The new component may replace component 310. All metadata from component 310 may be transferred to the new component. Each component of complex model 302 may be replaced by a respective new component to form simplified model 308.

Figure 4:
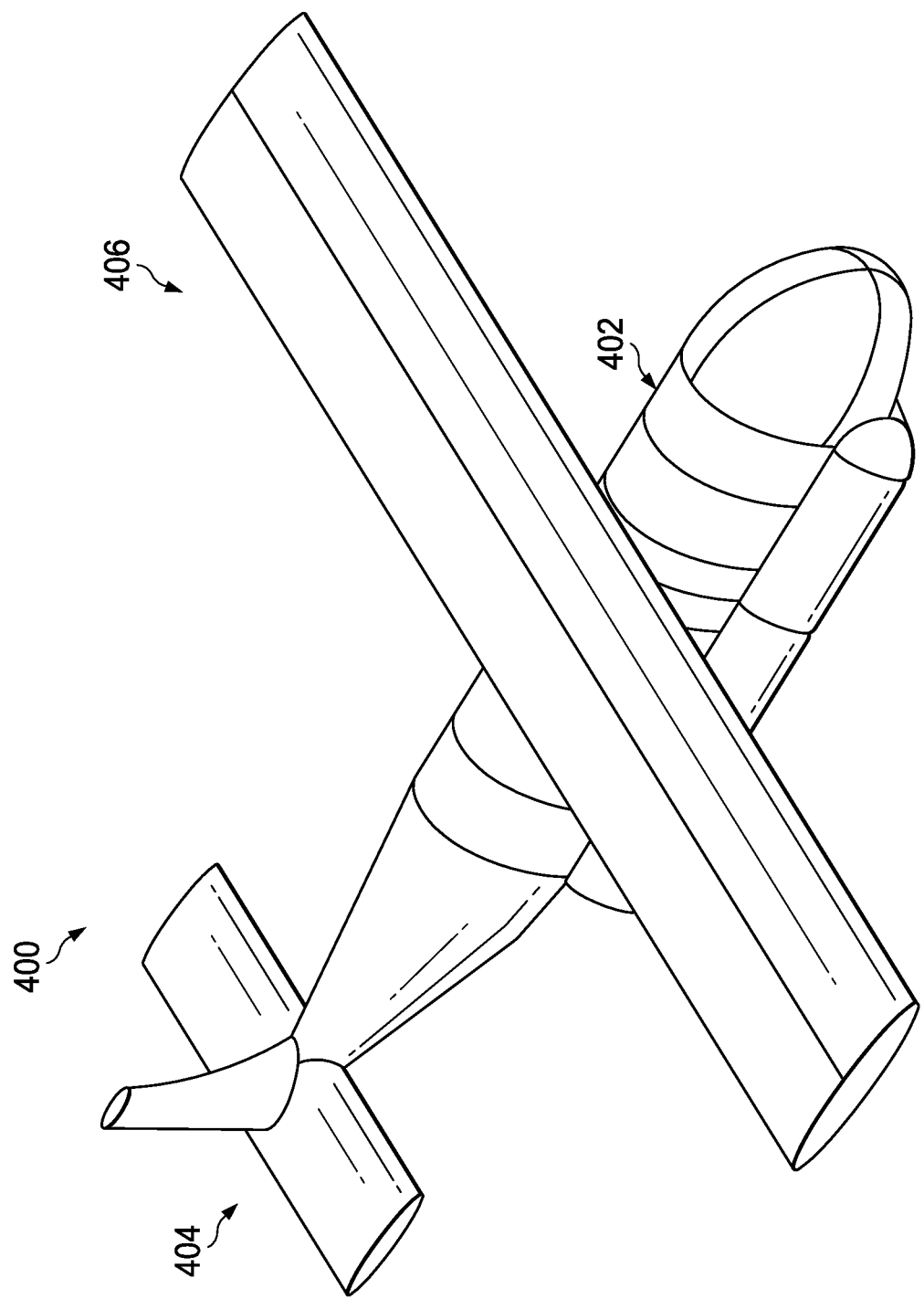
FIG. 4 is an illustration of a complex model in accordance with an illustrative embodiment.

Turning now to FIG. 4, an illustration of a complex model is depicted in accordance with an illustrative embodiment. Complex model 400 may be an example of complex model 110 of FIG. 1. Complex model 400 may be an example of a three-dimensional model of an aircraft.

Complex model 400 includes body 402, tail 404, and wings 406. As depicted, complex model 400 includes a plurality of complex curvatures.

Figure 5:
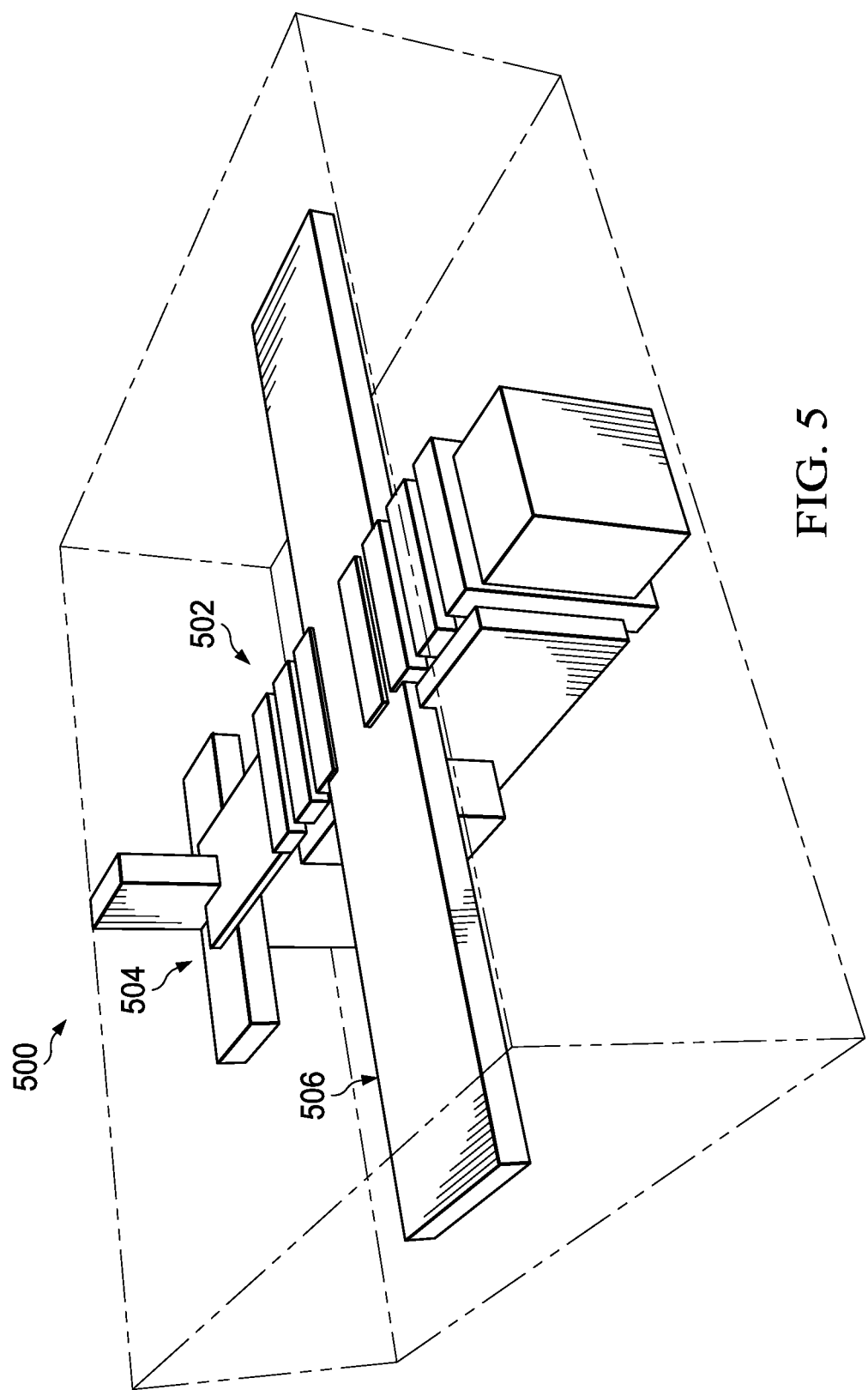
FIG. 5 is an illustration of a simplified model with one basic shape in accordance with an illustrative embodiment.

Turning now to FIG. 5, an illustration of a simplified model with one basic shape is depicted in accordance with an illustrative embodiment. Simplified model 500 may be an example of simplified model 150 of FIG. 1. Simplified model 500 may be a result of sending complex model 400 of FIG. 4 to a simplification system, such as simplification system 122 of FIG. 1.

Simplified model 500 may be a result of sending complex model 400 to a simplification system with a single shape in its respective shape library. Simplified model 500 may be a result of sending complex model 400 to a simplification system and selecting a desired fidelity to use only one shape. As depicted, each of body 502, tail 504, and wings 506 are formed of rectangular forms. Body 502 may be a plurality of rectangles. Body 502 may replace body 402 of complex model 400. Tail 504 may be a plurality of rectangles. Tail 504 may replace tail 404 of complex model 400. Wings 506 may be a single rectangle. Wings 506 may replace wings 406 of complex model 400.

Simplified model 500 may be displayed on a display device such as display device 178 of FIG. 1. An operator may view simplified model 500 prior to sending simplified model 500 to an analysis environment.

Figure 6:
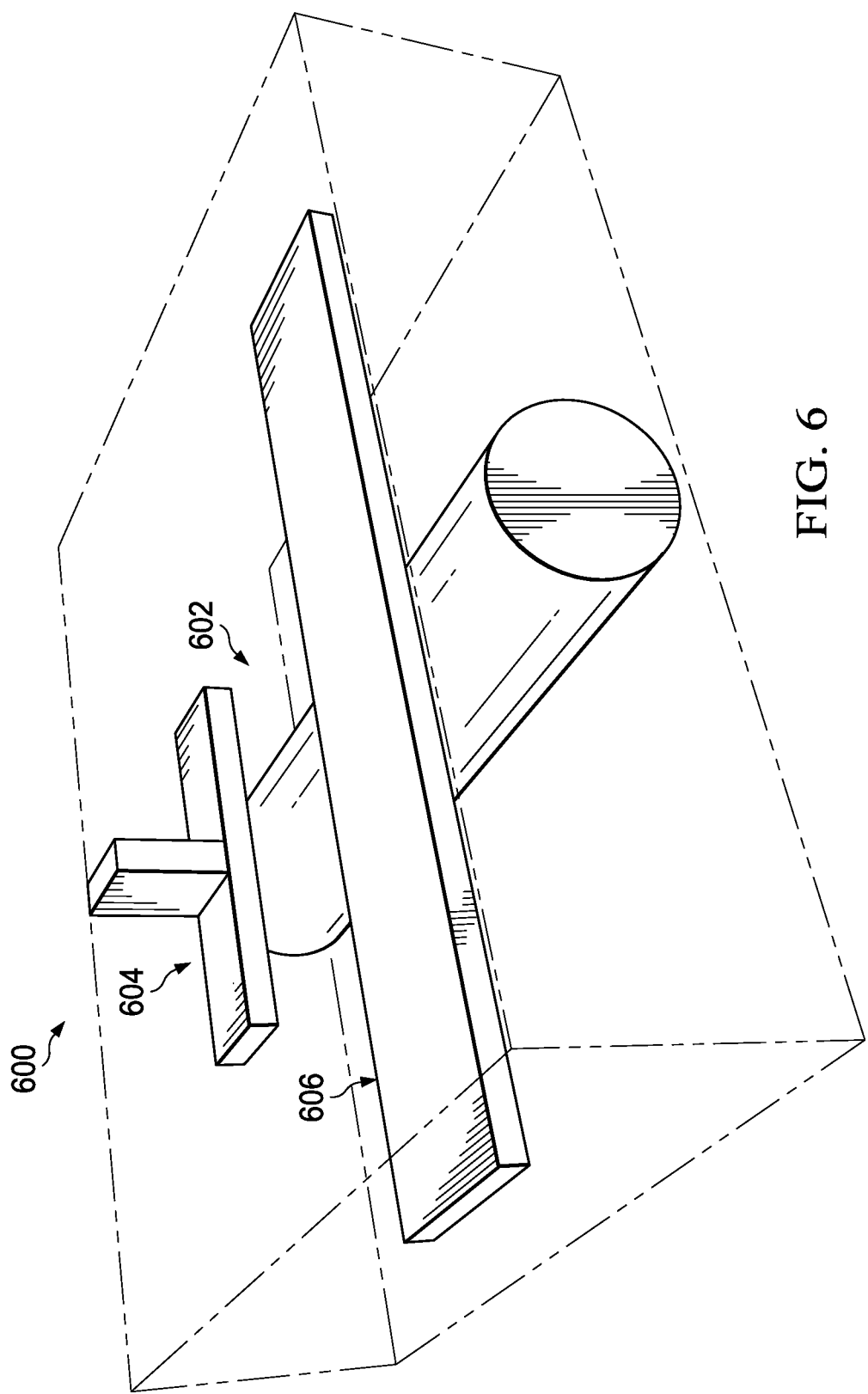
FIG. 6 is an illustration of a simplified model with two basic shapes in accordance with an illustrative embodiment.

Turning now to FIG. 6, an illustration of a simplified model with two basic shapes is depicted in accordance with an illustrative embodiment. Simplified model 600 may be an example of simplified model 150 of FIG. 1. Simplified model 600 may be a result of sending complex model 400 of FIG. 4 to a simplification system, such as simplification system 122 of FIG. 1.

Simplified model 600 may be a result of sending complex model 400 to a simplification system with two shapes in its respective shape library. Simplified model 600 may be a result of sending complex model 400 to a simplification system and selecting a desired fidelity to use only two shapes. As depicted, body 602 may be formed of a single cylindrical form. Body 602 may replace body 402 of complex model 400.

Tail 604 and wings 606 are formed of rectangular forms. Tail 604 may be a plurality of rectangles. Tail 604 may replace tail 404 of complex model 400. Wings 606 may be a single rectangle. Wings 606 may replace wings 406 of complex model 400.

Simplified model 600 may be displayed on a display device such as display device 178 of FIG. 1. An operator may view simplified model 600 prior to sending simplified model 600 to an analysis environment.

Figure 7:
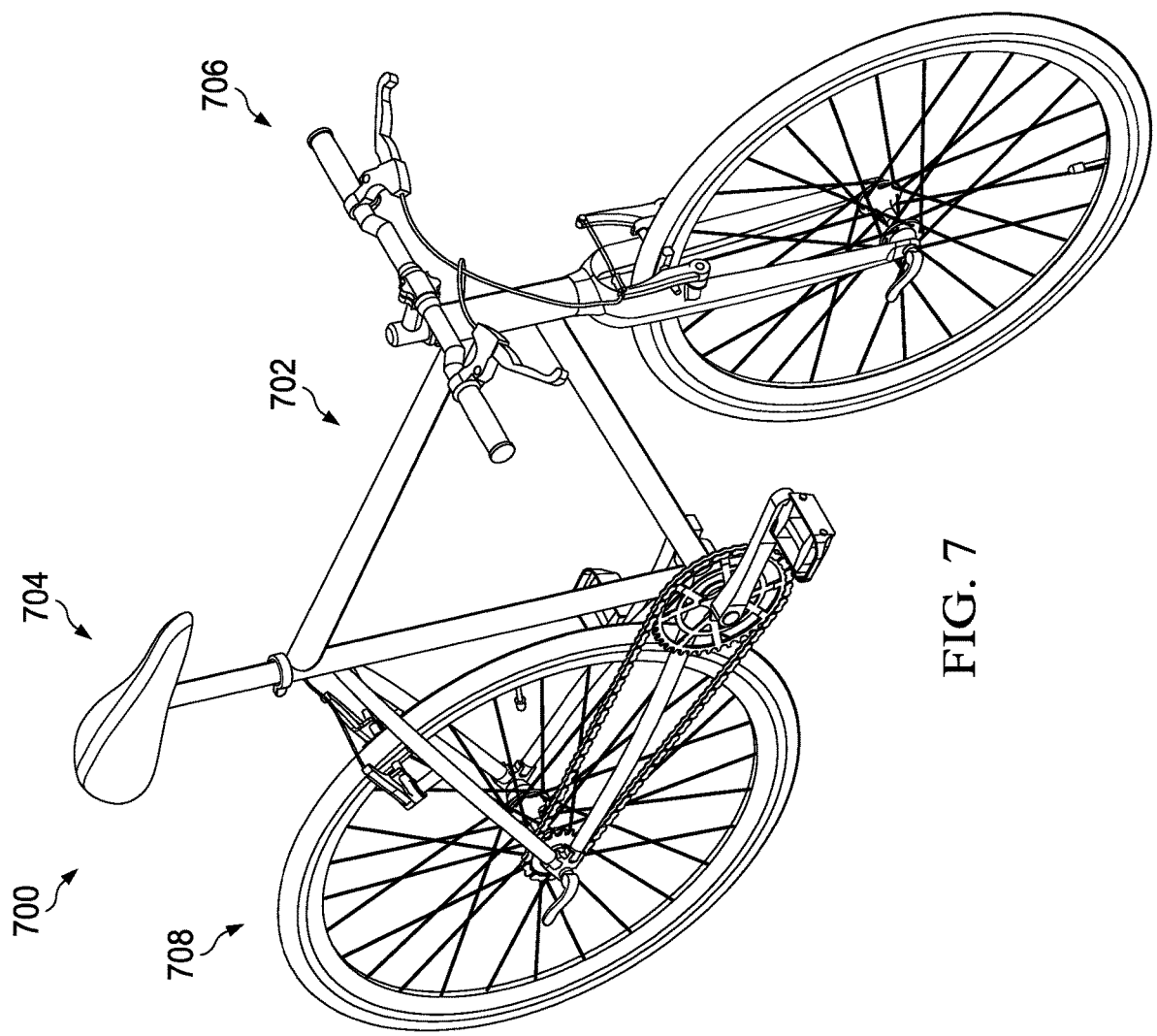
FIG. 7 is an illustration of a complex model in accordance with an illustrative embodiment.

Turning now to FIG. 7, an illustration of a complex model is depicted in accordance with an illustrative embodiment. Complex model 700 may be an example of complex model 110 of FIG. 1. Complex model 700 may be an example of a three-dimensional model of a bicycle.

Complex model 700 includes frame 702, seat 704, handles 706, and wheels 708. As depicted, complex model 700 includes a plurality of complex curvatures.

Figure 8:
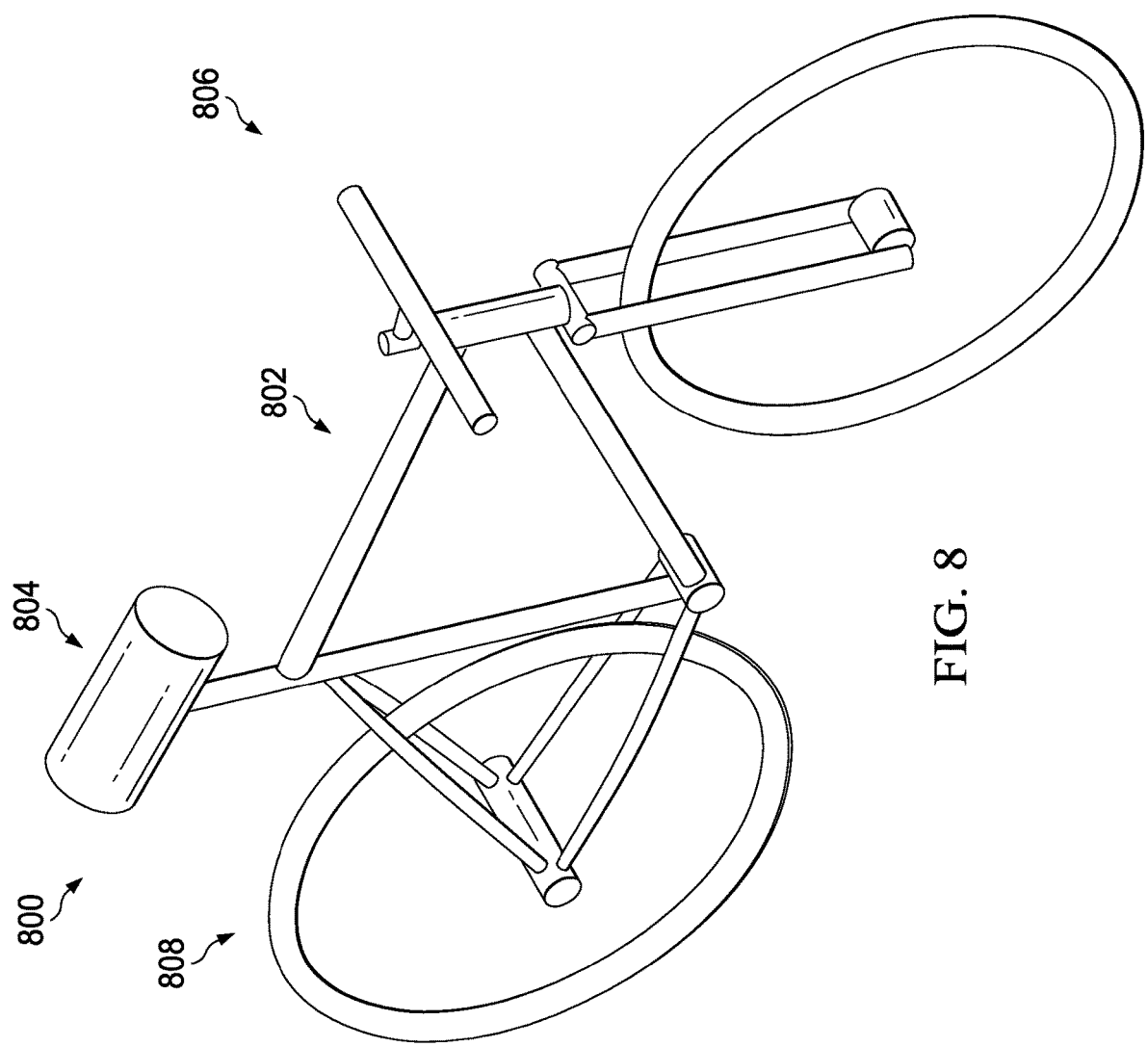
FIG. 8 is an illustration of a simplified model with one basic shape in accordance with an illustrative embodiment.

Turning now to FIG. 8, an illustration of a simplified model with one basic shape is depicted in accordance with an illustrative embodiment. Simplified model 500 may be an example of simplified model 150 of FIG. 1. Simplified model 800 may be a result of sending complex model 700 to a simplification system, such as simplification system 122 of FIG. 1.

Simplified model 800 may be a result of sending complex model 700 to a simplification system with a single shape in its respective shape library. Simplified model 800 may be a result of sending complex model 700 to a simplification system and selecting a desired fidelity to use only one shape. As depicted, each of frame 802, seat 804, handles 806, and wheels 808 are formed of cylindrical forms. Frame 802 may be a plurality of cylinders. Frame 802 may replace frame 702 of complex model 700. Seat 804 may be a single cylinder. Seat 804 may replace seat 704 of complex model 700. Handles 806 may be a single cylinder. Handles 806 may replace handles 706 of complex model 700. Wheels 808 may be a plurality of cylinders. Wheels 808 may replace wheels 708 of complex model 700.

Simplified model 800 may be displayed on a display device such as display device 178 of FIG. 1. An operator may view simplified model 800 prior to sending simplified model 800 to an analysis environment.

Figure 9:
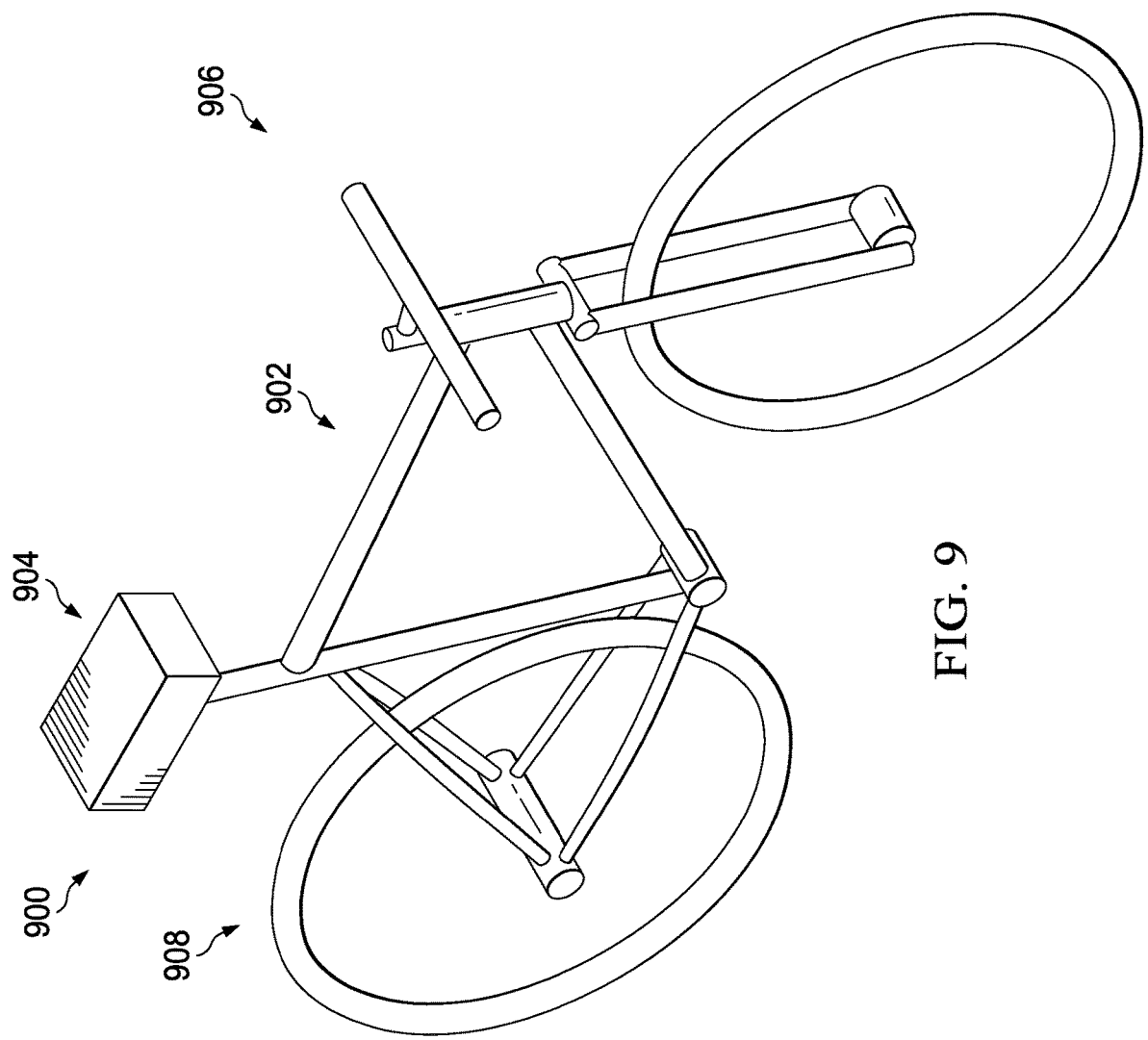
FIG. 9 is an illustration of a simplified model with two basic shapes in accordance with an illustrative embodiment.

Turning now to FIG. 9, an illustration of a simplified model with two basic shapes is depicted in accordance with an illustrative embodiment. Simplified model 900 may be an example of simplified model 150 of FIG. 1. Simplified model 900 may be a result of sending complex model 700 to a simplification system, such as simplification system 122 of FIG. 1.

Simplified model 900 may be a result of sending complex model 700 to a simplification system with two shapes in its respective shape library. Simplified model 900 may be a result of sending complex model 700 to a simplification system and selecting a desired fidelity to use only two shapes. As depicted, frame 902 may be a plurality of cylinders. Frame 902 may replace frame 702 of complex model 700. Seat 904 may be a single rectangle. Seat 904 may replace seat 704 of complex model 700. Handles 906 may be a single cylinder. Handles 906 may replace handles 706 of complex model 700. Wheels 908 may be a plurality of cylinders. Wheels 908 may replace wheels 708 of complex model 700.

Simplified model 900 may be displayed on a display device such as display device 178 of FIG. 1. An operator may view simplified model 900 prior to sending simplified model 900 to an analysis environment.

Figure 10:
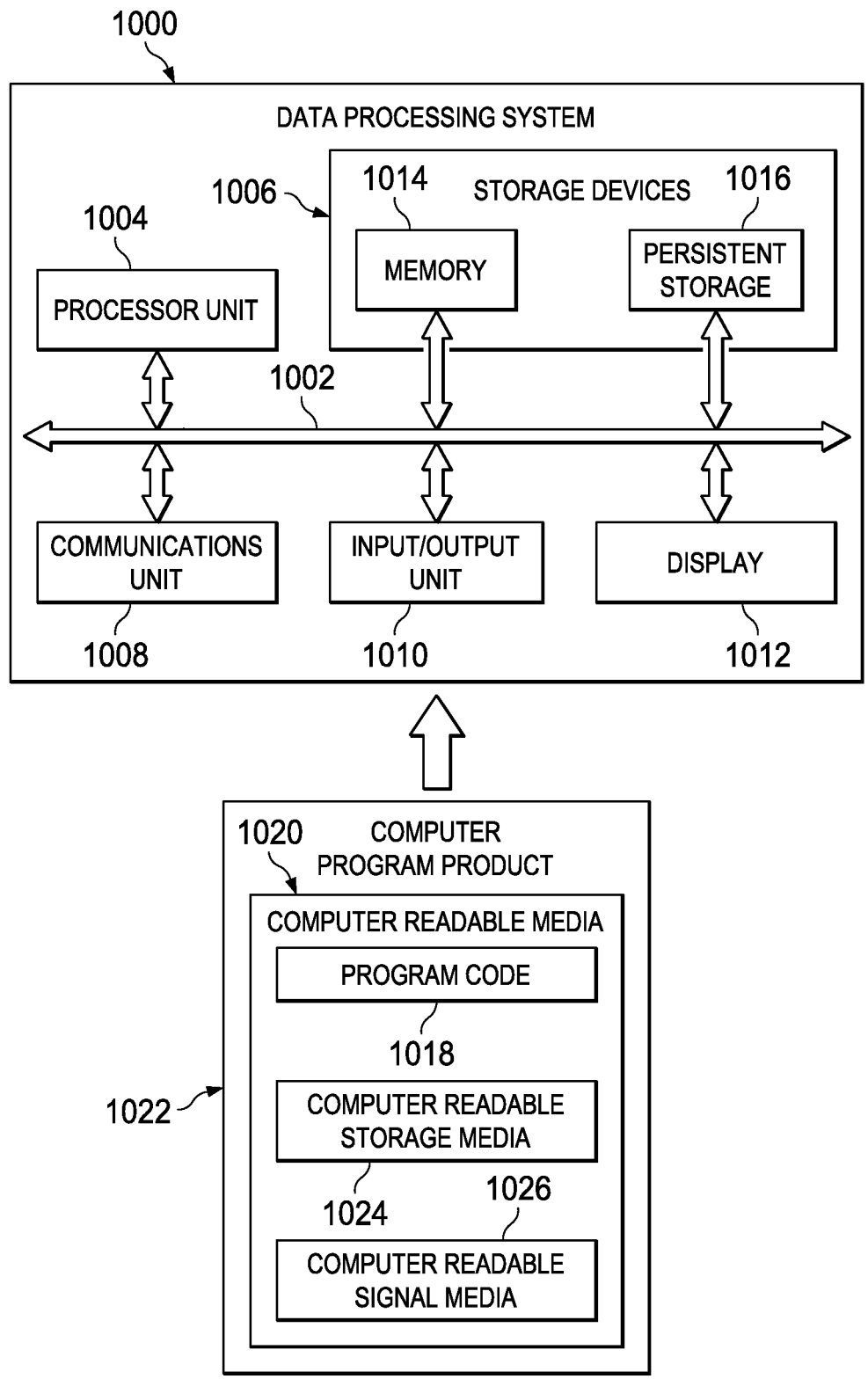
FIG. 10 is an illustration of a block diagram of a data processing system in accordance with an illustrative embodiment.

Turning now to FIG. 10, an illustration of a block diagram of a data processing system is depicted in accordance with an illustrative embodiment. Data processing system 1000 may be used to implement computer system 286 in FIG. 2. As depicted, data processing system 1000 includes communications framework 1002, which provides communications between processor unit 1004, storage devices 1006, communications unit 1008, input/output unit 1010, and display 1012. In some cases, communications framework 1002 may be implemented as a bus system.

Processor unit 1004 is configured to execute instructions for software to perform a number of operations. Processor unit 1004 may comprise a number of processors, a multiprocessor core, and/or some other type of processor, depending on the implementation. In some cases, processor unit 1004 may take the form of a hardware unit, such as a circuit system, an application-specific integrated circuit (ASIC), a programmable logic device, or some other suitable type of hardware unit.

Instructions for the operating system, applications, and/or programs run by processor unit 1004 may be located in storage devices 1006. Storage devices 1006 may be in communication with processor unit 1004 through communications framework 1002. As used herein, a storage device, also referred to as a computer-readable storage device, is any piece of hardware capable of storing information on a temporary and/or permanent basis. This information may include, but is not limited to, data, program code, and/or other information.

Memory 1014 and persistent storage 1016 are examples of storage devices 1006. Memory 1014 may take the form of, for example, a random access memory or some type of volatile or non-volatile storage device. Persistent storage 1016 may comprise any number of components or devices. For example, persistent storage 1016 may comprise a hard drive, a flash memory, a rewritable optical disk, a rewritable magnetic tape, or some combination of the above. The media used by persistent storage 1016 may or may not be removable.

Communications unit 1008 allows data processing system 1000 to communicate with other data processing systems and/or devices. Communications unit 1008 may provide communications using physical and/or wireless communications links.

Input/output unit 1010 allows input to be received from and output to be sent to other devices connected to data processing system 1000. For example, input/output unit 1010 may allow user input to be received through a keyboard, a mouse, and/or some other type of input device. As another example, input/output unit 1010 may allow output to be sent to a printer connected to data processing system 1000.

Display 1012 is configured to display information to a user. Display 1012 may comprise, for example, without limitation, a monitor, a touch screen, a laser display, a holographic display, a virtual display device, and/or some other type of display device.

In this illustrative example, the processes of the different illustrative embodiments may be performed by processor unit 1004 using computer-implemented instructions. These instructions may be referred to as program code, computer-usable program code, or computer-readable program code and may be read and executed by one or more processors in processor unit 1004.

In these examples, program code 1018 is located in a functional form on computer-readable media 1020, which is selectively removable, and may be loaded onto or transferred to data processing system 1000 for execution by processor unit 1004. Program code 1018 and computer-readable media 1020 together form computer program product 1022. In this illustrative example, computer-readable media 1020 may be computer-readable storage media 1024 or computer-readable signal media 1026.

Computer-readable storage media 1024 is a physical or tangible storage device used to store program code 1018 rather than a medium that propagates or transmits program code 1018. Computer-readable storage media 1024 may be, for example, without limitation, an optical or magnetic disk or a persistent storage device that is connected to data processing system 1000.

Alternatively, program code 1018 may be transferred to data processing system 1000 using computer-readable signal media 1026. Computer-readable signal media 1026 may be, for example, a propagated data signal containing program code 1018. This data signal may be an electromagnetic signal, an optical signal, and/or some other type of signal that can be transmitted over physical and/or wireless communications links.

The illustration of data processing system 1000 in FIG. 10 is not meant to provide architectural limitations to the manner in which the illustrative embodiments may be implemented. The different illustrative embodiments may be implemented in a data processing system that includes components in addition to or in place of those illustrated for data processing system 1000. Further, components shown in FIG. 10 may be varied from the illustrative examples shown.

The different components shown in FIGS. 2-10 may be combined with components in FIG. 1, used with components in FIG. 1, or a combination of the two. Additionally, some of the components in FIGS. 2-10 may be illustrative examples of how components shown in block form in FIG. 1 can be implement d as physical structures.

Figures 11, 12:
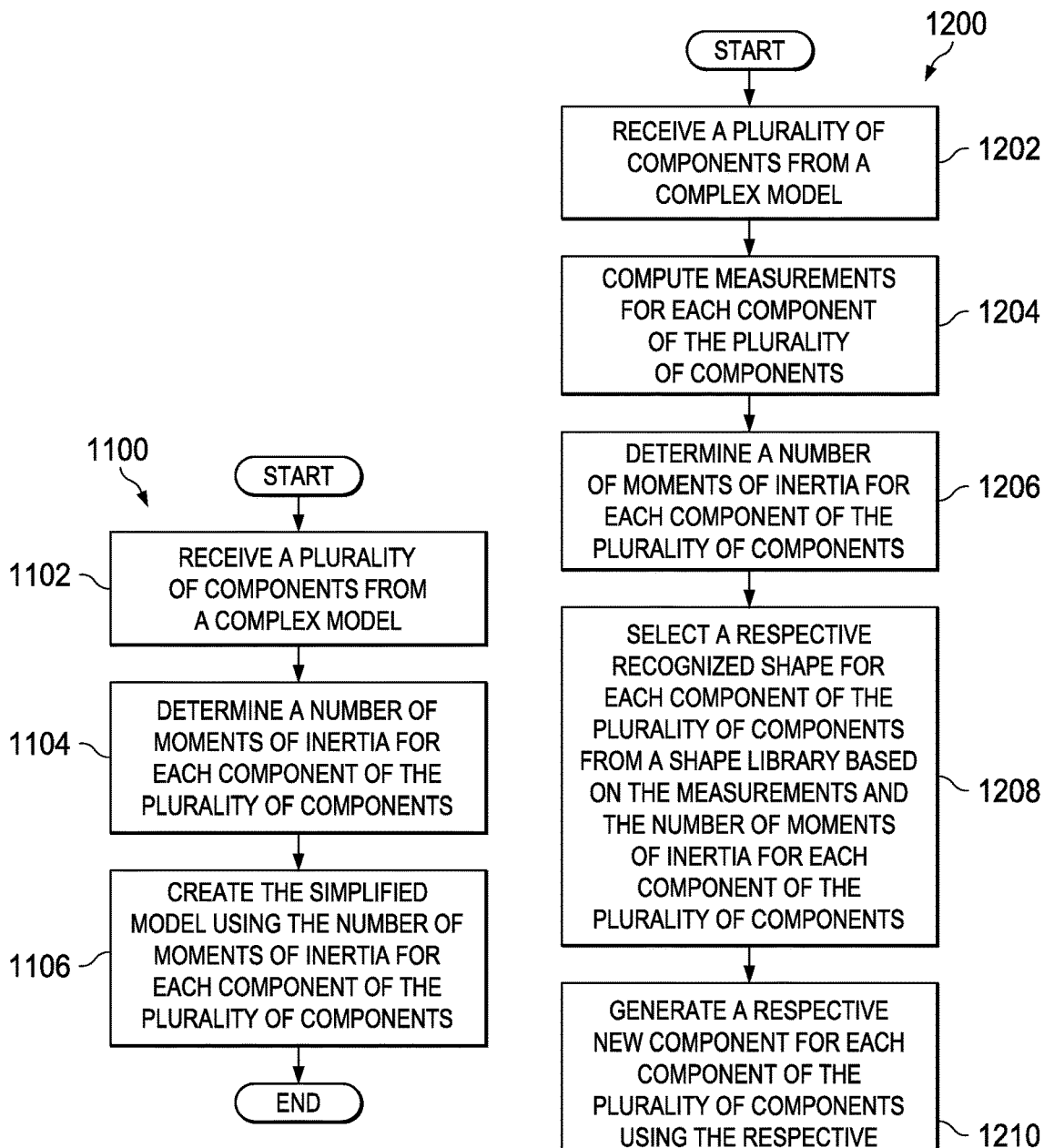
FIG. 11 is an illustration of a flowchart of a process for forming a simplified model in accordance with an illustrative embodiment.
FIG. 12 is an illustration of a flowchart of a process for forming a simplified model in accordance with an illustrative embodiment.

Turning now to FIG. 11, an illustration of a flowchart of a process for forming a simplified model is depicted in accordance with an illustrative embodiment. Process 1100 may be implemented in simplification system 122 of FIG. 1. More specifically, process 1100 may be used to form simplified model 150 of FIG. 1. In some illustrative examples, process 1100 may be used to form a simplified model from complex model 400 of FIG. 4 or complex model 700 of FIG. 7.

Process 1100 may begin by receiving a plurality of components from a complex model (operation 1102). Process 1100 may receive the plurality of components one component at a time. For example, a single component may go through each of operations 1102 through 1106 prior to process 1100 receiving the next component. In some illustrative examples, process 1100 may receive multiple components substantially simultaneously.

A number of moments of inertia may be determined for each component of the plurality of components (operation 1104). The number of moments of inertia may include at least one of a principal moment of inertia or a secondary moment of inertia. For example, at least one of principal moment 138 or secondary moment 140 of FIG. 1 may be determined. The number of moments of inertia may be determined using traditional physics and mathematical calculations.

The simplified model may be created using the number of moments of inertia for each component of the plurality of components (operation 1106). Afterwards, the process terminates. The simplified model may then be used to make decisions regarding the design for a product. For example, an analysis may be performed on the simplified model. An engineer may decide to continue with the design in the complex model if the analysis of the simplified model produces desired results. As another example, an engineer may make changes to the complex model based on undesired results of the analysis of the simplified model.

Turning now to FIG. 12, an illustration of a flowchart of a process for forming a simplified model is depicted in accordance with an illustrative embodiment. Process 1200 may be implemented in simplification system 122 of FIG. 1. More specifically, process 1200 may be used to form simplified model 150 of FIG. 1. In some illustrative examples, process 1200 may be used to form a simplified model from complex model 400 of FIG. 4 or complex model 700 of FIG. 7.

Process 1200 may begin by receiving a plurality of components from a complex model (operation 1202). Process 1200 may receive the plurality of components one component at a time. For example, a single component may go through each of operations 1202 through 1212 prior to process 1200 receiving the next component. In some illustrative examples, process 1200 may receive multiple components substantially simultaneously.

Measurements for each component of the plurality of components may be computed (operation 1204). The measurements may include at least one of a height, a width, a length, or a center of the component. The measurements may be represented by a bounding box that surrounds the component.

A number of moments of inertia may be determined for each component of the plurality of components (operation 1206). The number of moments of inertia may include at least one of a principal moment of inertia or a secondary moment of inertia. For example, at least one of principal moment 138 or secondary moment 140 of FIG. 1 may be determined. The number of moments of inertia may be determined using traditional physics and mathematical calculations.

A respective shape may be selected for each component of the plurality of components from a shape library based on the measurements and the number of moments of inertia for each component of the plurality of components (operation 1208). In some illustrative examples, the shape library may only include a single shape. For example, a shape library may only include a rectangular shape. In another illustrative example, the shape library may include more than one shape. For example, a shape library may include at least one of a rectangular shape, a sphere, a cylinder, or a pyramid.

A respective new component may be generated for each component of the plurality of components using the respective shape for each component of the plurality of components (operation 1210). Each of the components may be replaced with its respective new component to create the simplified model (operation 1212). Afterwards, the process terminates.

The simplified model may then be used to make decisions regarding the design for a product. For example, an analysis may be performed on the simplified model. An engineer may decide to continue with the design in the complex model if the analysis of the simplified model produces desired results. As another example, an engineer may make changes to the complex model based on undesired results of the analysis of the simplified model.

Figure 13:
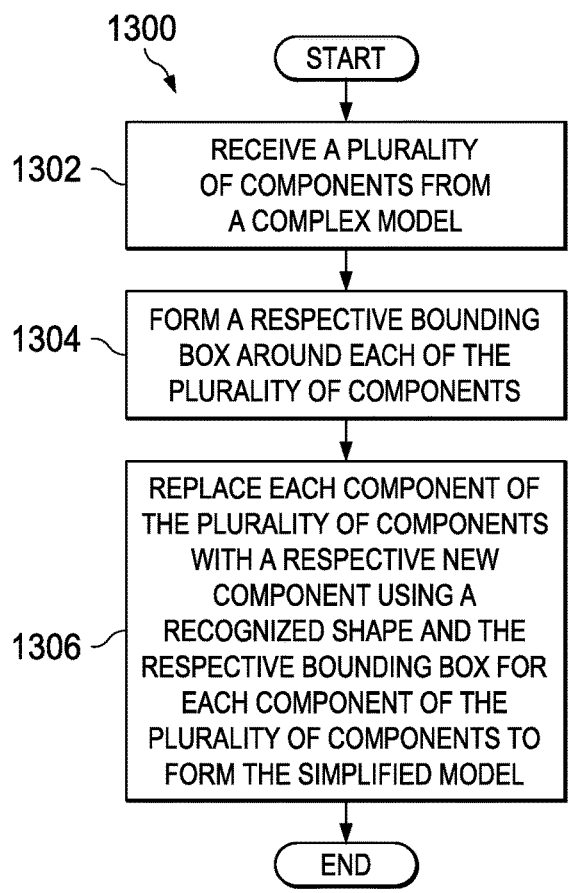
FIG. 13 is an illustration of a flowchart of a process for forming a simplified model in accordance with an illustrative embodiment.

Turning now to FIG. 13, an illustration of a flowchart of a process for forming a simplified model is depicted in accordance with an illustrative embodiment. Process 1300 may be implemented in simplification system 122 of FIG. 1. More specifically, process 1300 may be used to form simplified model 150 of FIG. 1. In some illustrative examples, process 1300 may be used to form a simplified model from complex model 400 of FIG. 4 or complex model 700 of FIG. 7.

Process 1300 may receive a plurality of components from a complex model (operation 1302). Process 1300 may receive the plurality of components one component at a time. For example, a single component may go through each of operations 1302 through 1306 prior to process 1300 receiving the next component. In some illustrative examples, process 1300 may receive multiple components substantially simultaneously.

A respective bounding box may be formed around each of the plurality of components (operation 1304). Each bounding box may represent measurements of the respective component. For example, a bounding box may be a representation of a height, a width, and a length of the component. In some examples, the bounding box may also represent a center of the component.

Each component of the plurality of components may be replaced with a respective new component using a recognized shape and the respective bounding box for each component of the plurality of components to form the simplified model (operation 1306). Afterwards, the process terminates.

The simplified model may then be used to make decisions regarding the design for a product. For example, an analysis may be performed on the simplified model. An engineer may decide to continue with the design in the complex model if the analysis of the simplified model produces desired results. As another example, an engineer may make changes to the complex model based on undesired results of the analysis of the simplified model.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

For example, process 1100 may further comprise computing a height, a length, a width, and a center for each component of the plurality of components. In some examples, process 1100 may further comprise selecting a respective shape for each component of the plurality of components from a shape library. In some examples, selecting the respective shape for each component of the plurality of components comprises determining a volume of each component of the plurality of components.

In one illustrative example, process 1100 may further comprise creating a three-dimensional solid from a candidate shape. A volume of the three-dimensional solid may be calculated. A volume of a component of the plurality of components may be calculated. A difference between the volume of the three-dimensional solid and the volume of the component may be determined. A second three-dimensional solid may be created from a second candidate shape. A volume of the second three-dimensional solid may be calculated. A second difference between the volume of the second three-dimensional solid and the volume of the component may be determined. A recognized shape may be selected based on the difference and the second difference.

In one illustrative example, creating the simplified model using the number of moments of inertia for each component of the plurality of components in process 1100 comprises generating a new component from the recognized shape and deleting the component. In one example, in process 1100, metadata from the component is transferred to the new component.

As another example, process 1200 of FIG. 12 may further include running a test on the simplified model to form a result, using the result to modify design parameters for a structure, and manufacturing the structure after modifying the design parameters using the result. In another example, process 1200 may include running a test on the simplified model to form a result, wherein running the test on the simplified model reduces a time to design a structure represented by the simplified model.

As another example, process 1300 may further include selecting a respective recognized shape for each component of the plurality of components from a shape library based on the respective bounding box for each component of the plurality of components. In some illustrative examples, process 1300 may further include running a test on the simplified model to form a result, and displaying the result.

Figure 14:
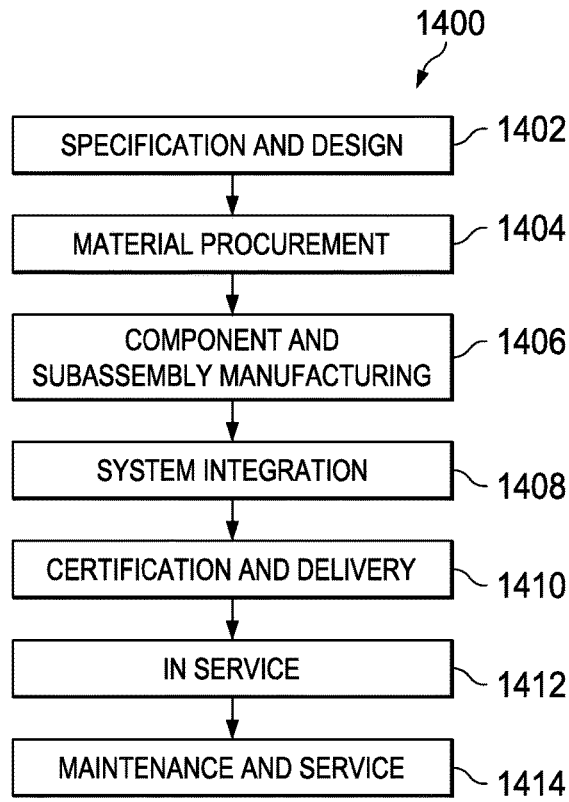
FIG. 14 is an illustration of an aircraft manufacturing and service method in the form of a block diagram in accordance with an illustrative embodiment.
Figure 15:
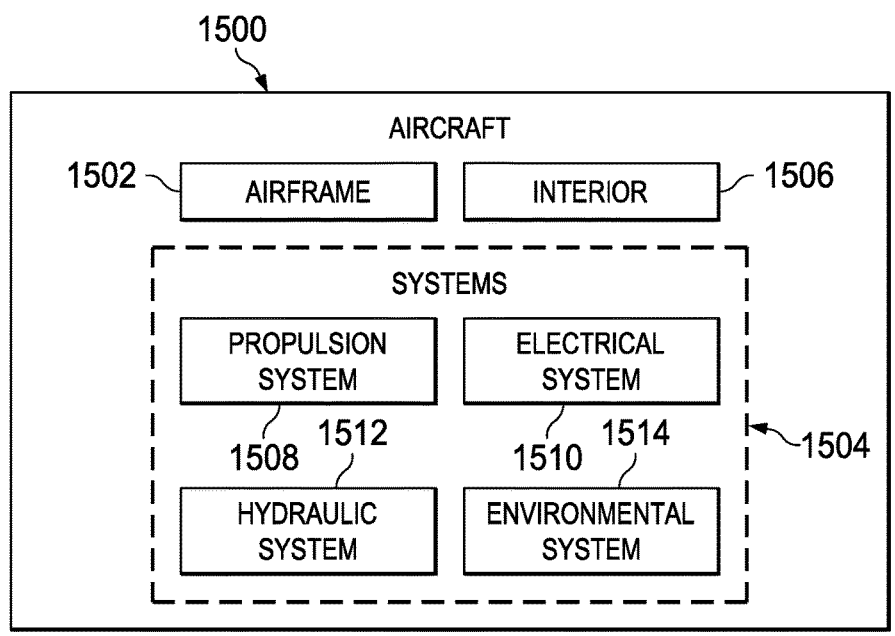
FIG. 15 is an illustration of an aircraft in the form of a block diagram in which an illustrative embodiment may be implemented.

The illustrative embodiments of the present disclosure may be described in the context of aircraft manufacturing and service method 1400 as shown in FIG. 14 and aircraft 1500 as shown in FIG. 15. Turning first to FIG. 14, an illustration of an aircraft manufacturing and service method is depicted in the form of a block diagram in accordance with an illustrative embodiment. During pre-production, aircraft manufacturing and service method 1400 may include specification and design 1402 of aircraft 1500 of FIG. 15 and material procurement 1404.

During production, component and subassembly manufacturing 1406 and system integration 1408 of aircraft 1500 of FIG. 15 takes place. Thereafter, aircraft 1500 of FIG. 15 may go through certification and delivery 1410 in order to be placed in service 1412. While in service 1412 by a customer, aircraft 1500 of FIG. 15 is scheduled for routine maintenance and service 1414, which may include modification, reconfiguration, refurbishment, and other maintenance or service.

Each of the processes of aircraft manufacturing and service method 1400 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 15, an illustration of an aircraft is depicted in the form of a block diagram in which an illustrative embodiment may be implemented. In this example, aircraft 1500 is produced by aircraft manufacturing and service method 1400 of FIG. 14 and may include airframe 1502 with systems 1504 and interior 1506. Examples of systems 1504 include one or more of propulsion system 1508, electrical system 1510, hydraulic system 1512, and environmental system 1514. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1400 of FIG. 14. One or more illustrative embodiments may be used during specification and design 1402. For example, simplification system 122 may be used to create a simplified model of aircraft 1500 during specification and design 1402. An analysis, such as analysis 114, may be performed on the simplified model of aircraft 1500 during specification and design 1402.

Thus, the illustrative embodiments provide a method and apparatus for formation of a simplified model. A simplified model may be automatically formed from a provided complex model. Each component of the complex model may be replaced by a shape from a shape library. In some illustrative examples, features below a desired size may be removed in the simplified model. The simplified model may be analyzed in a shorter period of time than the complex model. By reducing the time spent performing an analysis, an overall manufacturing time may be reduced.

For example, a complex model may have a desired fidelity for manufacturing of a product. However, the desired fidelity for an analysis may be significantly below that of the complex model. Accordingly, the desired fidelity of the complex model may be in excess of that required for the analysis. Performing the analysis on the complex model may take an undesirable period of time.

By automatically simplifying a complex model, the time to analyze the design may be reduced. By reducing the time to perform an analysis, the efficiency of a computer system used to perform the analysis may be increased. By reducing the time to perform an analysis, computer resources used during the analysis may also be reduced. This may leave computer resources free for other processes. Accordingly, the user may more quickly receive and evaluate the analysis. Further, by automatically simplifying a complex model to a simplified model, more analyses may be performed in a same period of time.

By automatically simplifying the complex model, human errors in simplification may be reduced or eliminated. Further, by automatically simplifying the complex model, simplification may take less time than manual simplification. Yet further, by removing manual simplification, overall design labor may be reduced.

The different illustrative embodiments can take the form of an entirely hardware embodiment, an entirely software embodiment, or an embodiment containing both hardware and software elements. Some embodiments are implemented in software, which includes, but is not limited to, forms such as, for example, firmware, resident software, and microcode.

Furthermore, the different embodiments can take the form of a computer program product accessible from a computer-usable or computer-readable medium providing program code for use by or in connection with a computer or any device or system that executes instructions. For the purposes of this disclosure, a computer-usable or computer-readable medium can generally be any tangible apparatus that can contain, store, communicate, propagate, or transport the program for use by or in connection with the instruction execution system, apparatus, or device.

The computer-usable or computer-readable medium can be, for example, without limitation, an electronic, magnetic, optical, electromagnetic, infrared, or semiconductor system, or a propagation medium. Non-limiting examples of a computer-readable medium include a semiconductor or solid state memory, magnetic tape, a removable computer diskette, a random access memory (RAM), a read-only memory (ROM), a rigid magnetic disk, and an optical disk. Optical disks may include a compact disk—read only memory (CD-ROM), a compact disk—read/write (CD-R/W), and a DVD.

Further, a computer-usable or computer-readable medium may contain or store a computer-readable or computer-usable program code such that when the computer-readable or computer-usable program code is executed on a computer, the execution of this computer-readable or computer-usable program code causes the computer to transmit another computer-readable or computer-usable program code over a communications link. This communications link may use a medium that is, for example, without limitation, physical or wireless.

A data processing system suitable for storing and/or executing computer-readable or computer-usable program code will include one or more processors coupled directly or indirectly to memory elements through a communications fabric, such as a system bus. The memory elements may include local memory employed during actual execution of the program code, bulk storage, and cache memories which provide temporary storage of at least some computer-readable or computer-usable program code to reduce the number of times the code may be retrieved from bulk storage during execution of the code.

Input/output or I/O devices can be coupled to the system either directly or through intervening I/O controllers. These devices may include, for example, without limitation, keyboards, touch screen displays, and pointing devices. Different communications adapters may also be coupled to the system to enable the data processing system to become coupled to other data processing systems, remote printers, or storage devices through intervening private or public networks. Non-limiting examples of modems and network adapters are just a few of the currently available types of communications adapters.

The description of the different illustrative embodiments has been presented for purposes of illustration and description, and is not intended to be exhaustive or limited to the embodiments in the form disclosed. The different illustrative examples describe components that perform actions or operations. In an illustrative embodiment, a component may be configured to perform the action or operation described. For example, the component may have a configuration or design for a structure that provides the component an ability to perform the action or operation that is described in the illustrative examples as being performed by the component.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A computer system comprising:
a simplification system that receives a plurality of components from a complex model, determines a number of moments of inertia for each component of the plurality of components, and creates a simplified model using a desired fidelity for the simplified model and the number of moments of inertia for the each component of the plurality of components, wherein the complex model is a three-dimensional computer model, wherein the simplified model is a three-dimensional computer model, and wherein the simplified model has a desired fidelity less than a fidelity of the complex model.

2. The computer system of claim 1, wherein the simplification system comprises a bounding box function that computes a height, a length, a width, and a center for the each component of the plurality of components.

3. The computer system of claim 1, wherein the simplification system comprises a shape recognition module that selects a respective recognized shape for the each component of the plurality of components from a shape library.

4. The computer system of claim 3, wherein the shape library includes at least one of a rectangle, a sphere, a cylinder, or a pyramid.

5. The computer system of claim 3, wherein the shape recognition module selects the respective recognized shape for the each component of the plurality of components by determining a volume of the each component of the plurality of components.

6. The computer system of claim 1, wherein the simplification system comprises a shape recognition module that creates a three-dimensional solid from a candidate shape, calculates a volume of the three-dimensional solid, calculates a volume of a component of the plurality of components, determines a difference between the volume of the three-dimensional solid and the volume of the component, creates a second three-dimensional solid from a second candidate shape, calculates a volume of the second three-dimensional solid, determines a second difference between the volume of the second three-dimensional solid and the volume of the component, and selects a recognized shape based on the difference and the second difference.

7. The computer system of claim 6, wherein the simplification system further comprises a solid substitution module that generates a new component from the recognized shape and deletes the component.

8. The computer system of claim 7, wherein the solid substitution module transfers metadata from the component to the new component.

9. The computer system of claim 1, wherein the simplification system comprises a moment of inertia module and the number of moments of inertia includes a principal moment and a secondary moment for the each component of the plurality of components.

10. The computer system of claim 1, wherein the simplification system further computes measurements of the plurality of components, selects a respective recognized shape for the each component of the plurality of components from a shape library based on the measurements and the number of moments of inertia for the each component of the plurality of components, and creates the simplified model using the respective recognized shape for the each component of the plurality of components.

11. A method for forming a simplified model, the method comprising:
receiving, by a computer system, a plurality of components from a complex model, wherein the complex model is a three-dimensional computer model;
determining, by the computer system, a number of moments of inertia for each component of the plurality of components; and
creating, by the computer system, the simplified model using a desired fidelity for the simplified model and the number of moments of inertia for the each component of the plurality of components, wherein the simplified model is a three-dimensional computer model, and wherein the simplified model has a desired fidelity less than a fidelity of the complex model.

12. The method of claim 11 further comprising:
computing, by the computer system, a height, a length, a width, and a center for the each component of the plurality of components.

13. The method of claim 11 further comprising:
selecting, by the computer system, a respective recognized shape for the each component of the plurality of components from a shape library.

14. The method of claim 13, wherein selecting the respective recognized shape for the each component of the plurality of components comprises determining a volume of the each component of the plurality of components.

15. The method of claim 11 further comprising:
creating, by the computer system, a three-dimensional solid from a candidate shape;

calculating, by the computer system, a volume of the three-dimensional solid;

calculating, by the computer system, a volume of a component of the plurality of components;

determining, by the computer system, a difference between the volume of the three-dimensional solid and the volume of the component;

creating, by the computer system, a second three-dimensional solid from a second candidate shape;

calculating, by the computer system, a volume of the second three-dimensional solid;

determining, by the computer system, a second difference between the volume of the second three-dimensional solid and the volume of the component; and selecting, by the computer system, a recognized shape based on the difference and the second difference.

16. The method of claim 15, wherein creating the simplified model using the number of moments of inertia for the component of the plurality of components comprises:

generating, by the computer system, a new component from the recognized shape and deleting the component.

17. The method of claim 16, wherein metadata from the component is transferred to the new component.

18. A method for forming a simplified model, the method comprising:

receiving, by a computer system, a plurality of components from a complex model and a desired fidelity for the simplified model, wherein the complex model is a three-dimensional computer model, and wherein the desired fidelity for the simplified model is less than a fidelity of the complex model;

computing, by the computer system, measurements for each component of the plurality of components;

determining, by the computer system, a number of moments of inertia for the each component of the plurality of components;

selecting, by the computer system, a respective recognized shape for the each component of the plurality of components from a shape library based on the measurements and the number of moments of inertia for the each component of the plurality of components, and wherein a quantity of shapes in the shape library is selected based on the desired fidelity;

generating, by the computer system, a respective new component for the each component of the plurality of components using the respective recognized shape for the each component of the plurality of components; and replacing the each component of the plurality of components with its respective new component, by the computer system, to create the simplified model, wherein the simplified model is a three-dimensional computer model.

19. The method of claim 18 further comprising:

running an analysis, by the computer system, on the simplified model to form a result;

using the result to modify, by the computer system, design parameters for a structure; and manufacturing the structure after modifying the design parameters using the result.

20. The method of claim 18 further comprising:

running, by the computer system, an analysis on the simplified model to form a result, wherein running the analysis on the simplified model reduces a time to design a structure represented by the simplified model.

21. A method for forming a simplified model, the method comprising:

receiving a plurality of components from a complex model, wherein the complex model is a three-dimensional computer model;

forming a respective bounding box around each component of the plurality of components; and replacing the each component of the plurality of components with a respective new component using a desired fidelity for the simplified model, a recognized shape, and the respective bounding box for the each component of the plurality of components to form the simplified model, wherein the simplified model is a three-dimensional computer model, and wherein the desired fidelity for the simplified model is less than a fidelity of the complex model.

22. The method of claim 21 further comprising:

selecting a respective recognized shape for the each component of the plurality of components from a shape library based on the respective bounding box for the each component of the plurality of components.

23. The method of claim 21 further comprising:

running an analysis on the simplified model to form a result; and displaying the result.

* * * * *